(12) United States Patent
Van Winkelhoff et al.

(10) Patent No.: US 9,659,614 B2
(45) Date of Patent: May 23, 2017

(54) INTEGRATED KEEPER CIRCUIT

(71) Applicant: ARM Limited, Cambridge (GB)

(72) Inventors: Nicolaas Van Winkelhoff, Grenoble (FR); Fabien Leroy, Grenoble (FR)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 14/849,474

(22) Filed: Sep. 9, 2015

(65) Prior Publication Data
US 2017/0069361 A1   Mar. 9, 2017

(51) Int. Cl.
*G11C 7/12*   (2006.01)

(52) U.S. Cl.
CPC .................................. *G11C 7/12* (2013.01)

(58) Field of Classification Search
USPC ....................................................... 365/203
See application file for complete search history.

(56) References Cited

U.S. PATENT DOCUMENTS

| | | | |
|---|---|---|---|
| 7,239,178 B1* | 7/2007 | Cornell | H03K 19/018521 326/68 |
| 2010/0246293 A1* | 9/2010 | Dudeck | G11C 7/04 365/194 |
| 2014/0226418 A1* | 8/2014 | Ganesan | G11C 7/065 365/189.011 |

* cited by examiner

*Primary Examiner* — Hoai V Ho
*Assistant Examiner* — Minh Dinh
(74) *Attorney, Agent, or Firm* — Pramudji Law Group PLLC; Ari Pramudji

(57) ABSTRACT

Various implementations described herein are directed to a keeper circuit coupled to a bitline input path and configured to provide a first voltage source signal to the bitline input path based on a keeper enable signal. The keeper circuit may include an NMOS transistor. Further, a logic device may be coupled to the bitline input path and configured to receive the bitline input signal, receive the first voltage source signal from the keeper circuit, and provide an inverted bitline input signal as an output signal.

15 Claims, 8 Drawing Sheets

INTEGRATED KEEPER CIRCUIT

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Integrated circuits include circuitry to perform monitoring functions to assist with preserving a logical state. For instance, FIG. 1 shows a conventional keeper circuit 100 for memory. In this circuit 100, when memory goes into read, a pre-charge 124 is cut-off (prech_top), and a bitline 110 (e.g., rbl/bl/gbl) will be floating high. Due to many bit cells (not shown) in memory, the bitline 110 will drop over time, even when the bitline 110 is not programmed to drop. Typically, due to leakage, the bitline 110 may provide a wrong bit value. Further, leaky conditions, such as, e.g., high temperature, leaky process corner, number of bit cells, and some non-physical parameters, such as, e.g., added margin in simulations, may speed up bitline 110.

For many years, to avoid unwanted bitline drop, the conventional keeper 100 was used with a P-type Metal-Oxide-Semiconductor (PMOS) Pfb2 that is (substantially) weak so as to reduce its strength. In this configuration, the PMOS keeper Pfb2 compensates for the leakage. However, this does not track well over technology corners, voltages, and/or temperature ranges. In conventional technology, PMOS strength was varied to compensate for varying leakage. From process sizes of 40 nm and smaller, varying length is no longer applicable, and in these situations, designers compensate for this issue by stacking the keeper with multiple PMOS transistors in series, and counting on back-bias effects, which made these devices even weaker. In modern fin technologies, designers may use up to 5-6 PMOS transistors in series to achieve an overall weak PMOS transistor. In these situations, designers typically rely on series resistance of these series components instead of relying on transistor characteristics. It has been suggested to use a strong PMOS transistor to compensate for leakage. However, in these situations, during a read of a '0' (zero), the bitline 110 voltage should drop, and any PMOS transistor in the bitline path that hinders this voltage drop may significantly delay memory read-out. As such, there exists a need for a more effective keeper that improves power, performance and area (PPA) and/or voltage range of an integrated circuit.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to keeper circuitry for providing a state keeper or bleeder configured to preserve a logical state. Such circuitry may compensate for leakage currents or noise by injecting the same amount of energy (or current) in a circuit path for keeping a state safe. The keeper circuitry may be referred to as a process tracking keeper or bleeder. The keeper circuitry may be configured to utilize an N-type Metal-Oxide-Semiconductor (NMOS) transistor in the keeper path for tracking process corners. In this instance, a weak NMOS transistor in the matrix may provide a weak NMOS transistor in the keeper path. The weak NMOS transistor may function as a weak keeper to increase a read speed as a weak read current is not over compensated for by a strong keeper. In contrast, when a strong NMOS transistor is used, leakage of bit cells may be substantial; therefore, the strong NMOS transistor keeper may be strong enough to inhibit a substantial bitline drop. The state may be kept in balance.

Various implementations of keeper circuitry will now be described in more detail with reference to FIGS. 2-8.

Figure 1:
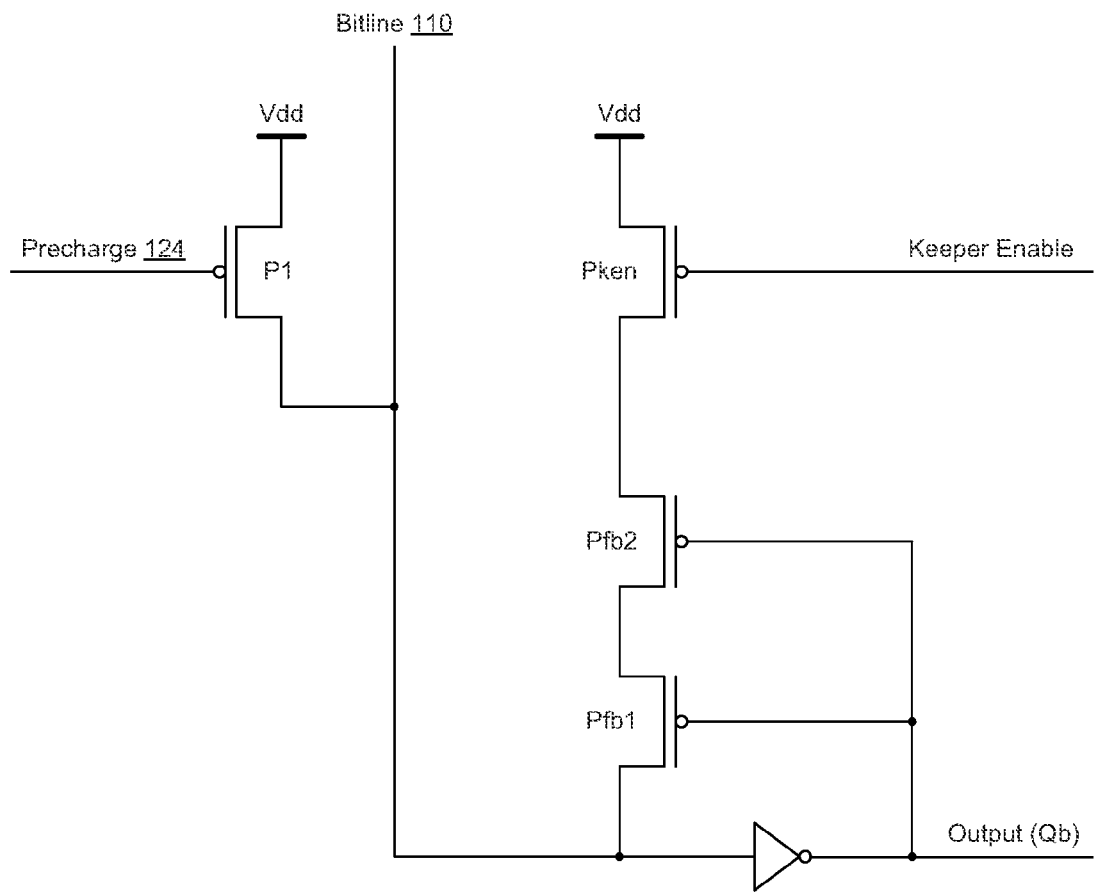
FIG. 1 illustrates a diagram of keeper circuitry as known in the art.
Figure 2:
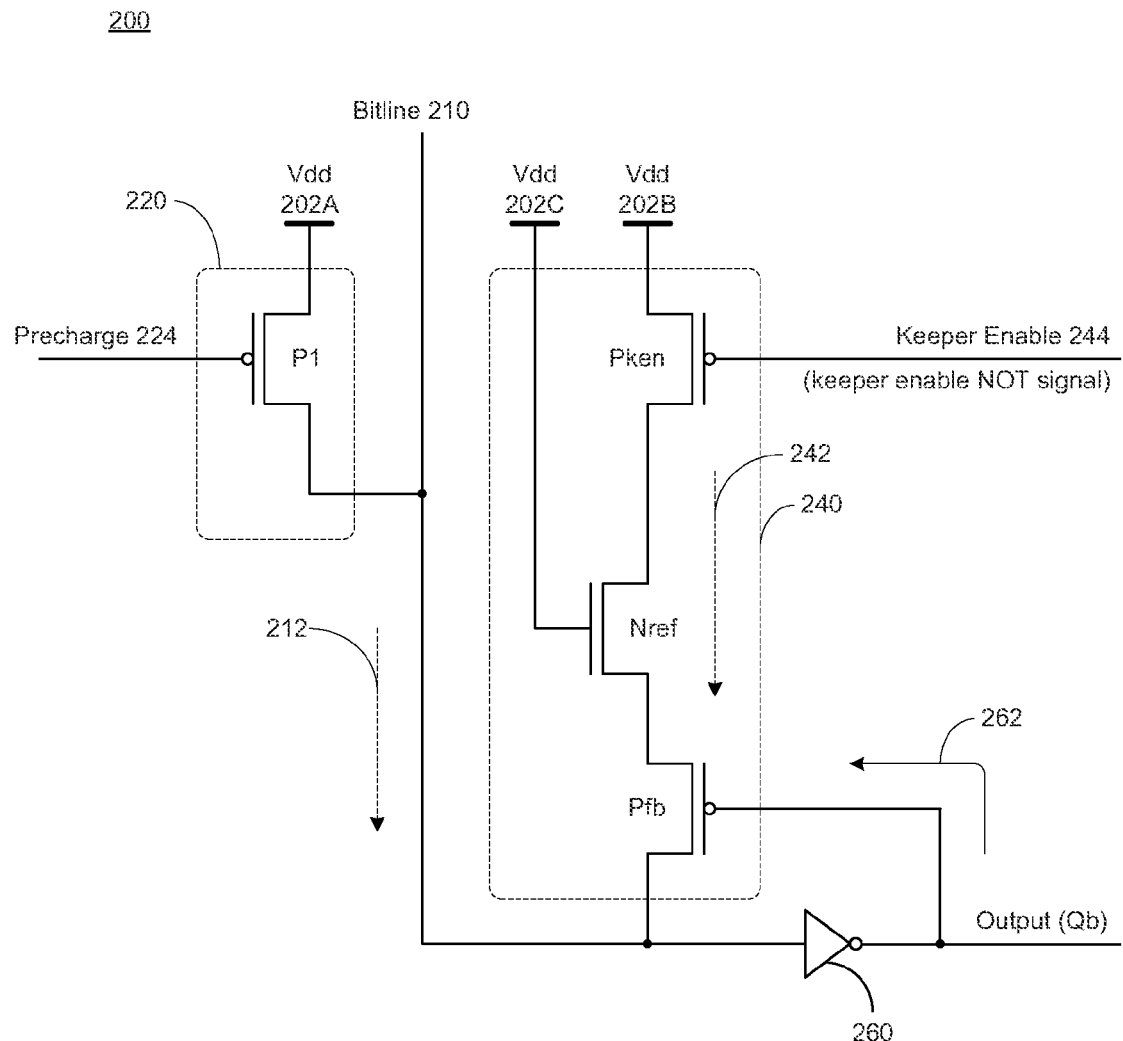
FIG. 2 illustrates a diagram of keeper circuitry in accordance with various implementations described herein.

FIG. 2 illustrates a block diagram of keeper circuitry 200 in accordance with various implementations described herein. The keeper circuitry 200 may be implemented as an integrated circuit with multiple stages and may be referred to as a keeper circuit. In some implementations, the multiple stages may be referred to as multiple sub-divided circuit portions having interdependent relationships.

The circuitry 200 may include a bitline 210 and bitline input path 212. The bitline 210 may be abbreviated as (bl) and may also be referred to as a read bitline (rbl) or a global bitline (gbl). In various implementations, the bitline 210 may be coupled to memory, such as, e.g., read-only memory (ROM), a register file, etc., and the bitline 210 may be used to read one or more bits and/or bytes in memory.

The circuitry 200 may include a precharge circuit 220 coupled to the bitline 210 along the bitline input path 212. The precharge circuit 220 may be configured to provide a first voltage source signal 202A (e.g., Vdd) to the bitline input path 212 based on a precharge enable signal 224. The precharge circuit 220 may include a first P-type Metal-Oxide-Semiconductor (PMOS) transistor P1 coupled to the bitline 210 along the bitline input path 212. The first PMOS transistor P1 may be configured to provide the first voltage source signal 202A to the bitline 210 and bitline input path 212 based on the precharge enable signal 224.

The circuitry 200 may include a keeper circuit 240 coupled to the bitline 210 along the bitline input path 212. The keeper circuit 240 may be configured to provide a second voltage source signal 202B (e.g., Vdd) to the bitline input path 212 via a keeper path 242 based on a keeper enable signal 244. In some instances, the keeper path 242 may be referred to as a keeper (not) path, and the keeper enable signal 244 may be referred to as a keeper enable (not) signal. As shown, the keeper circuit 240 may include an n-type metal-oxide-semiconductor (NMOS) transistor Nref coupled to the keeper path 242. In some implementations, the NMOS transistor Nref may include a Fin-shaped Field Effect Transistor (FinFET). The keeper circuit 240 may include a second PMOS transistor Pken coupled to the keeper path 242 before the NMOS transistor Nref. The second PMOS transistor Pken may be configured to provide the second voltage source signal 202B to the NMOS transistor Nref based on keeper enable (not) signal 244. As shown in FIG. 2, a third voltage source Vdd 202C may be coupled to a gate of the NMOS transistor Nref. In some implementations, the third voltage source Vdd 202C may be Vdd or may be Vdd+Vt, where Vt refers to a voltage threshold of the NMOS transistor Nref. As such, the NMOS transistor Nref may be coupled to a higher power domain, such as, e.g., Vdd+Vt. Further, in some implementations, the second PMOS transistor Pken may utilize a multi-fin type transistor (e.g., 2 fin), and the NMOS transistor Nref may utilize a multi-fin type transistor (e.g., 4 fin). However, various other multi-fin combinations may be utilized.

The circuitry 200 may include a logic device 260 coupled to the bitline 210 along the bitline input path 212. The logic device 260 may be configured to receive the bitline input signal, receive the first voltage source signal 202A from the precharge circuit 220, receive the second voltage source signal 202B from the keeper circuit 240, and provide an inverted bitline input signal as an output signal Qb. In some implementations, the logic device 260 may include an inverter. In other implementations, the logic device 260 may include a NAND gate. In various other implementations, the logic device 260 may include some other logic device configured as an inverter or NAND gate.

As shown in reference to FIG. 2, the keeper circuit 240 may include a third PMOS transistor Pfb coupled to the keeper path 242 after the NMOS transistor Nref. The third PMOS transistor Pfb may be configured to provide the second voltage source signal 202B to the bitline 210 and the bitline input path 212 based on the inverted bitline input signal (i.e., output signal Qb) received from the logic device 260. The NMOS transistor Nref may be configured to receive the second voltage source signal 202B from the second PMOS transistor Pken and provide the second voltage source signal 202B to the bitline 210 and bitline input path 212 based on a third voltage source signal 202C (e.g., Vdd). In some implementations, the NMOS transistor Nref may be configured to provide the second voltage source signal 202B to the third PMOS transistor Pfb via the keeper path 242 based on the third voltage source signal 202C. In some implementations, the third PMOS transistor Pfb may utilize a multi-fin type transistor (e.g., 2 fin). However, another multi-fin combination may be utilized.

Further, as shown in FIG. 2, a feedback path 262 may be provided from the logic device 262 to a gate of the third PMOS transistor Pfb. In this instance, the output signal Qb may be provided to the gate of the third PMOS transistor Pfb as a feedback signal to activate or deactivate the keeper path 242 based on the polarity of the output signal Qb. In some implementations, the third PMOS transistor Pfb may be referred to as a feedback PMOS transistor that is configured to cut-off the fighting current when the logic device 260 (e.g., inverter) has flipped state. For instance, when the inverter flips, bitline read of memory may be completed, and the value may have been determined.

In some implementations, the supply voltage Vdd may be configured to provide an input voltage of approximately 1.2V. In other implementations, the supply voltage Vdd may be configured to provide an input voltage within a range of approximately 0.3V to 1.5V. In still other implementations, the supply voltage Vdd may be configured to provide an input voltage within a range of approximately >0V to 3.3V. As described herein, each stage may be configured to utilize one or more circuit components that may be configured for operating together to perform brown-out detection. In some implementations, the supply voltage Vdd may not be less than about 1.0V, when using a thick-gate transistor, because the circuit may be configured to trip when the source voltage Vdd falls to, for example, about 0.9V.

In reference to the embodiment of FIG. 2, the keeper circuit 240 is configured to track the leakage in which it has to compensate for. In various implementations, the keeper circuit 240 may provide a tracking solution that may work in any situation and in any process corner, voltage, and temperature. The keeper circuit 240 includes an NMOS transistor Nref in the keeper path 242, which may track process corners. In some cases, a weak NMOS transistor (e.g., Nref) in the matrix will give a weak NMOS transistor (e.g., Nref) in the keeper path 242. The NMOS transistor Nref may increase read speed as the weak read current is not over compensated for by a strong keeper. When the NMOS transistor is strong and a lot of leakage of the bit cells is expected, the NMOS transistor keeper Nref may be strong and may prevent a substantial bitline drop. Therefore, the bitline 210 may be kept in balance with use of the NMOS transistor Nref. In some implementations, if the leaking device to compensate is of the PMOS type, then the keeper/bleeder device can be of the PMOS type also.

In some situations, MOS transistors may exhibit feedback behavior, and when Vds increases, MOS transistors may produce more current and limit bitline drop. In some instances, when flow for a 'logical 1' is read, pre-charging is stopped, and the bitline 210 floats. The bitline 210 should stay high, and NMOS transistor Nref will leak to compensate for leakage loss on the bitline 210. The leakage may be caused by many memory bit cells associated with the bitline 210. Subsequently, the bitline 210 will drop somewhat. The NMOS transistor Nref may still be in diode-leakage region. If the bitline 210 drops near to ~Vt (i.e., approximate drop from Vdd to Vdd−Vt, i.e., to Vdd minus voltage threshold), the NMOS transistor Nref goes into conductive mode, because the matrix leakage is higher than the NMOS transistor Nref is able to provide in its diode-region. This may provide approximately 10× to 1000× additional current than in sub-threshold mode. Further, this may provide compensation for leakage, and the bitline 210 may thus stay stable. Because the cell and keeper devices are of the same type (i.e., NMOS transistors), the leakage may follow similar characteristics, and the keeper 240 may track over process corners, voltage, and/or temperature. In some cases, noise on the bitline 210 may be corrected due to this balance of leakage. In other cases, this bitline lowering may not be a problem when the read cycle is substantially short, thus not giving time for the bitline 210 to drop.

In some other instances, when a logical '0' is read, and pre-charging is stopped, a programmed bit cell (not drawn) may draw the bitline 210 quickly to low. The keeper generated current may be as weak (or as strong), because the NMOS transistor Nref may be the same type of MOS transistor. Due to an ~1 Vt lower level, a fight between keeper current and bit cell current may be much later and more smooth and a free timing gain may thus be achieved. In some cases, the bitline 210 goes low until Vdd−Vt, without the keeper hindering this. This may give a first speed gain. When the bit cell is still drawing a full $I_{on}$, the bitcell current may be $In_{bitcell}$ for (vdd−vt). At that moment, the $I_{NMOS}{}^{keeper}$ is changing from diode region into triode region, this is still weak. This may give a fast further drop of the bitline 210 until the inverter 260 switches to thereby cut-off the keeper completely. In some cases, a 3× smaller fighting current over the conventional keeper may be provided, which may be translated in a much faster switching speed. Generally, the conventional keeper may not work at 0.6V, while the keeper 240 described herein may work until <0.4V.

In reference to FIG. 2, the keeper circuit 240 may provide a reduced area of 1PMOS transistor+1NMOS transistor, as opposed to the conventional keeper having 5PMOS transistors in series. Further, the keeper circuit 240 may provide a 10-50% speed gain, and 3× less crowbar currents may occur during the read, which may explain the speed gain.

In some cases, some speed gain may be up to 100%, because the conventional keeper functionally does not work well. For instance, fast P and slow N may fail, even with a 5 PMOS transistor stack keeper weakening. As described herein, the keeper circuit 240 may provide a speed gain, which may be substantial for lower voltages.

In some implementations, in reference to FIG. 2, the PMOS transistor Pken may be optional. However, to potentially avoid ERC errors and various other checks (e.g., normally an NMOS transistor is not provided on the power rail), this PMOS transistor Pken may be used. In some cases, the PMOS transistor Pken may be given a function to toggle on/off the keeper function. In other cases, when a local power is available, the PMOS transistor Pken may be left out or removed.

In some implementations, the PMOS transistor Pfb may be used as a feedback PMOS transistor that simply cuts of the fighting current when the inverter 260 has flipped. For instance, when the inverter 260 flips, the read of the memory may be done, and a value may have been decided.

Figure 3:
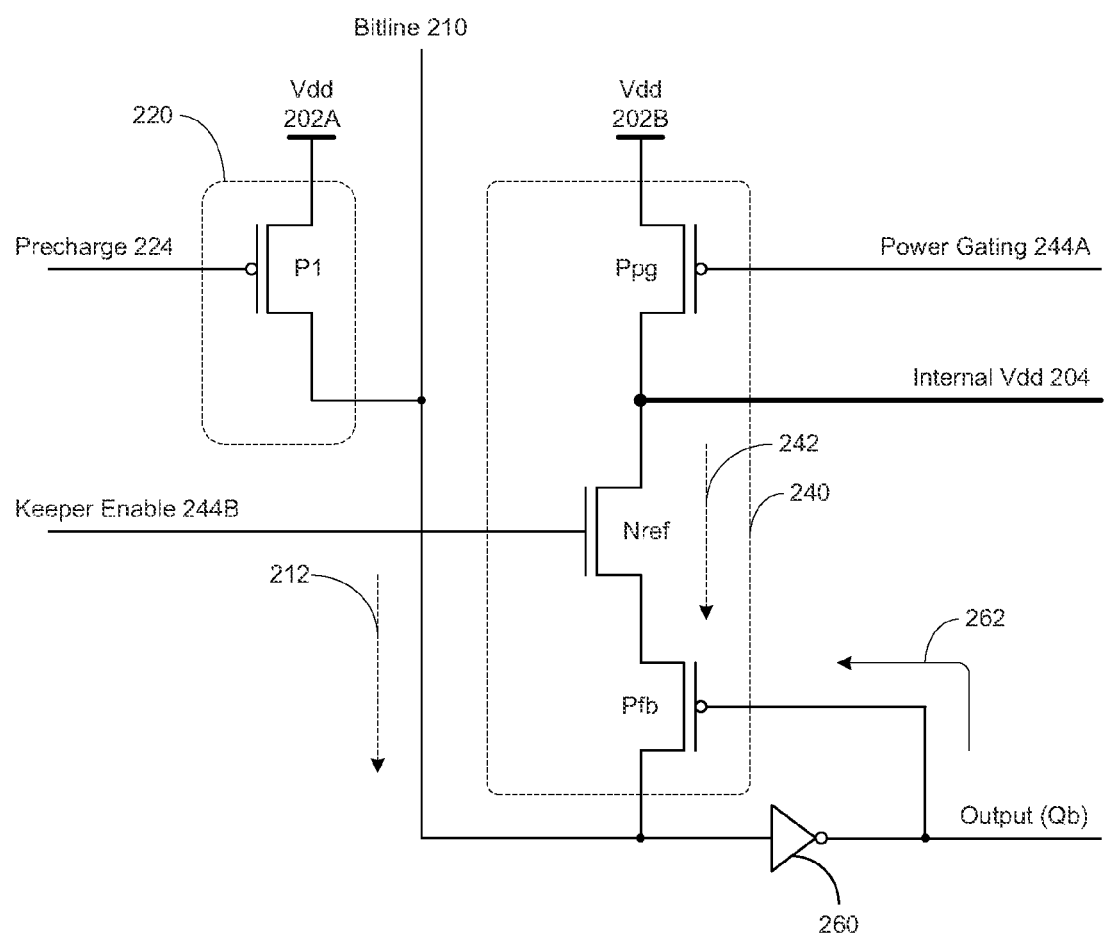
FIGS. 3-8 illustrate various other keeper circuitry in accordance with various implementations described herein.

FIG. 3 illustrates a diagram of another keeper circuit 300 in accordance with various implementations described herein. As shown in FIG. 3, the keeper circuit 300 may be implemented as an integrated circuit with multiple stages and may be referred to as keeper circuitry. Further, the multiple stages may be referred to as multiple sub-divided circuit portions having interdependent relationship.

The keeper circuit 300 is similar to the keeper circuit 200 of FIG. 2 with some modification. For instance, the top PMOS transistor Pken is now referred to as power gate PMOS transistor Ppg that may be used to support the ERC rules (Electrical Rule Check) by not having the NMOS transistor Nref connected directly to the supply rail voltage Vdd. As shown, a power gating signal 244A may be applied to a gate of the power gate PMOS transistor Ppg. When activated, the second voltage source signal 202B (e.g., Vdd) is allowed to pass through the power gate PMOS transistor Ppg. In some cases, when power gating is not available, the power gate PMOS transistor Ppg may be left out or removed. Further, an internal voltage supply Vdd 204 may be coupled between the power gate PMOS transistor Ppg and the NMOS transistor Nref. Further modification may refer to coupling a keeper enable signal 244B to a gate of the NMOS transistor Nref. In some implementations, the power gate PMOS transistor Ppg may utilize a multi-fin type transistor (e.g., 20 fin), and the NMOS transistor Nref may utilize a multi-fin type transistor (e.g., 4 fin). However, various other multi-fin combinations may be utilized.

Figure 4:
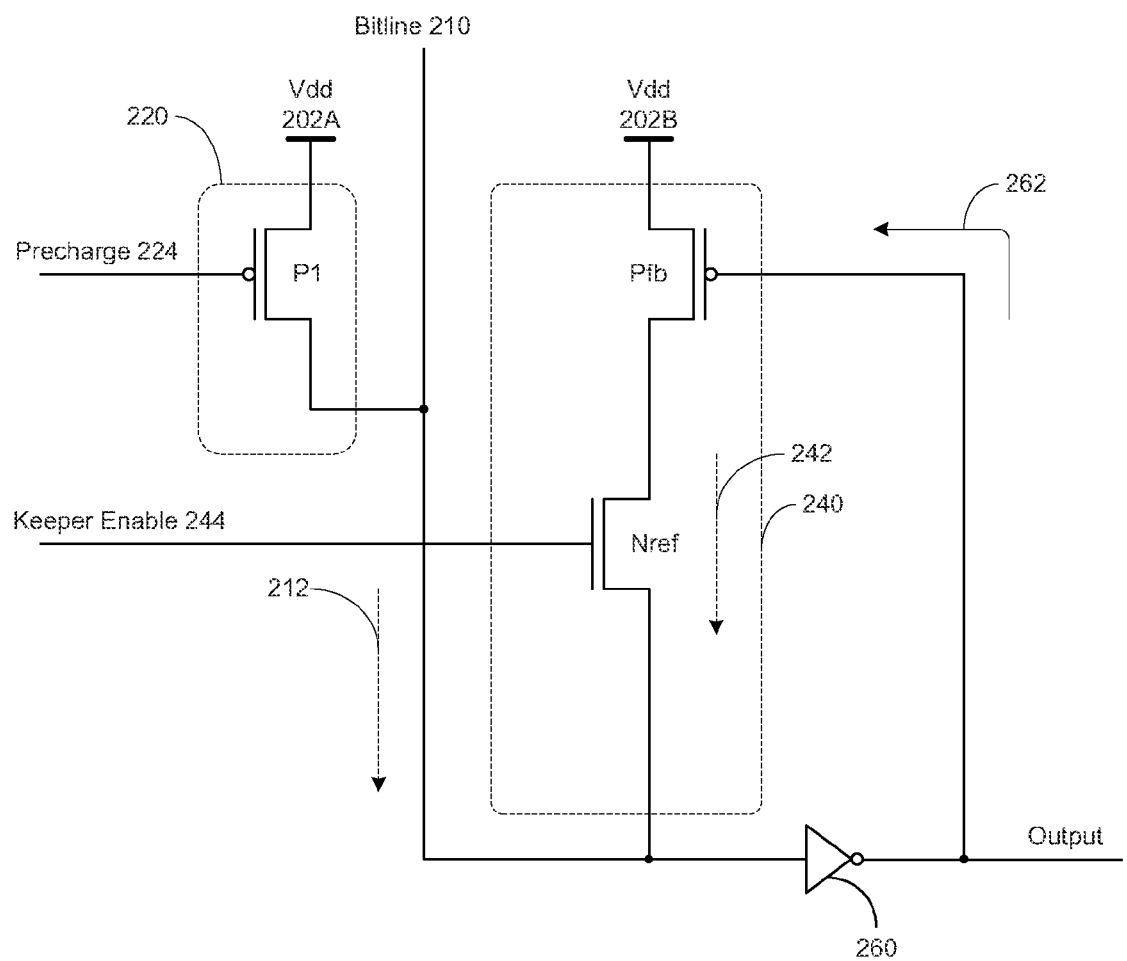

FIG. 4 illustrates a diagram of another keeper circuit 400 in accordance with various implementations described herein. As shown in FIG. 4, the keeper circuit 400 may be implemented as an integrated circuit with multiple stages and may be referred to as keeper circuitry. Further, the multiple stages may be referred to as multiple sub-divided circuit portions having interdependent relationship.

The keeper circuit 400 is similar to the keeper circuit 200 of FIG. 2 with some modification. For instance, the top PMOS transistor Pken is removed, and the lower PMOS transistor Pfb is positioned in its place, so that the PMOS transistor Pfb is positioned between the voltage supply Vdd 202B and the NMOS transistor Nref. Further modification may refer to coupling the keeper enable 244 to a gate of the NMOS transistor Nref. In some cases, due to keeper strength, this keeper circuit 400 may be slower, such as, e.g., a stronger keeper tree or stack may cause for a slower flip or slower switching of logic device 260. However, this keeper circuit 400 may be used for area optimization due to a reduced number of transistors.

Figure 5:
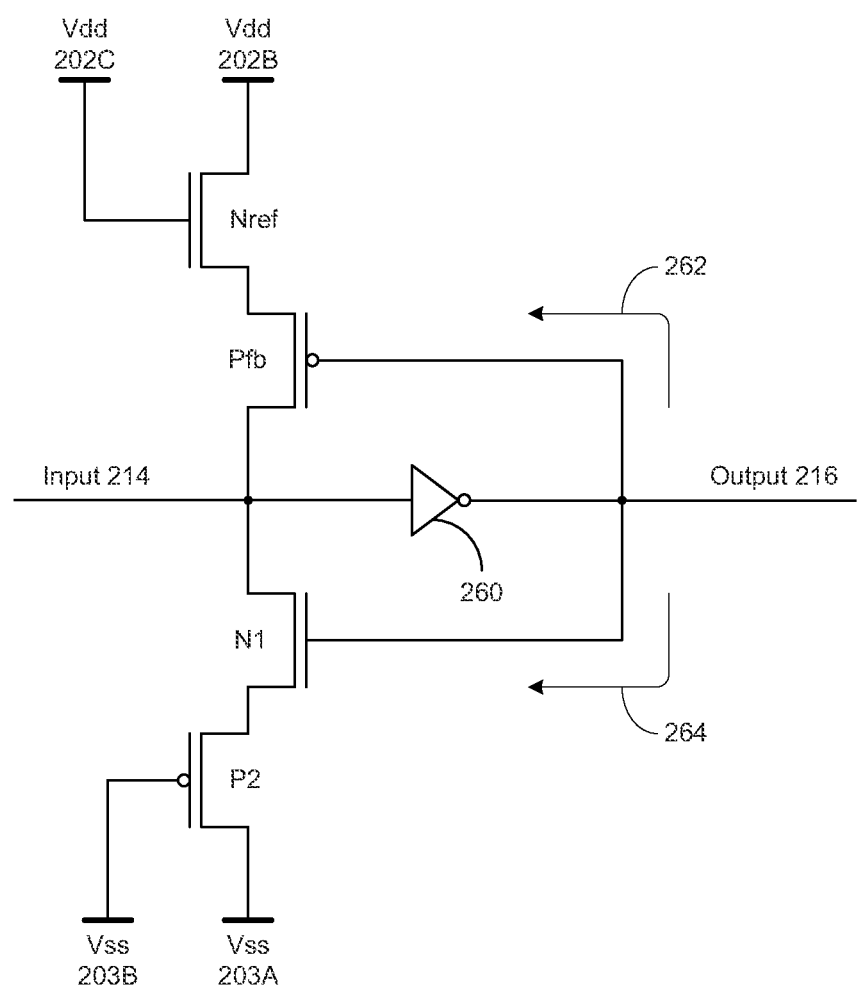

FIG. 5 illustrates a diagram of another keeper circuit 500 in accordance with various implementations described herein. As shown in FIG. 5, the keeper circuit 500 may be implemented as an integrated circuit with multiple stages and may be referred to as keeper circuitry. Further, the multiple stages may be referred to as multiple sub-divided circuit portions having interdependent relationship.

The keeper circuit 500 is similar to the keeper circuit 200 of FIG. 2 with some modification. For instance, the keeper circuit 500 may be used in a non-clocked latch type of configuration. In this instance, the NMOS transistor Nref is positioned between the voltage supply Vdd 202B and the lower PMOS transistor Pfb, and the voltage supply Vdd 202C may be coupled to the gate of the NMOS transistor Nref. In some implementations, the third voltage source Vdd 202C may be Vdd or may be Vdd+Vt, where Vt refers to a voltage threshold of the NMOS transistor Nref. Further, the arrangement of NMOS and PMOS transistors may include another NMOS transistor N1 coupled to the input line 214 and another PMOS transistor P2 disposed between the NMOS transistor N1 and another voltage supply Vss 203A, which may be a ground rail or ground (GND). In some cases, further modification may refer to another feedback path 264 of coupling an output 216 of the logic device 260 to a gate of the NMOS transistor N1. Still further, yet another power supply Vss 203B may be coupled to a gate of the PMOS transistor P2. In some implementations, the voltage supply Vss 202B may be Vss or may be Vss-Vt, where Vt refers to a voltage threshold of the PMOS transistor P2.

Figure 6:
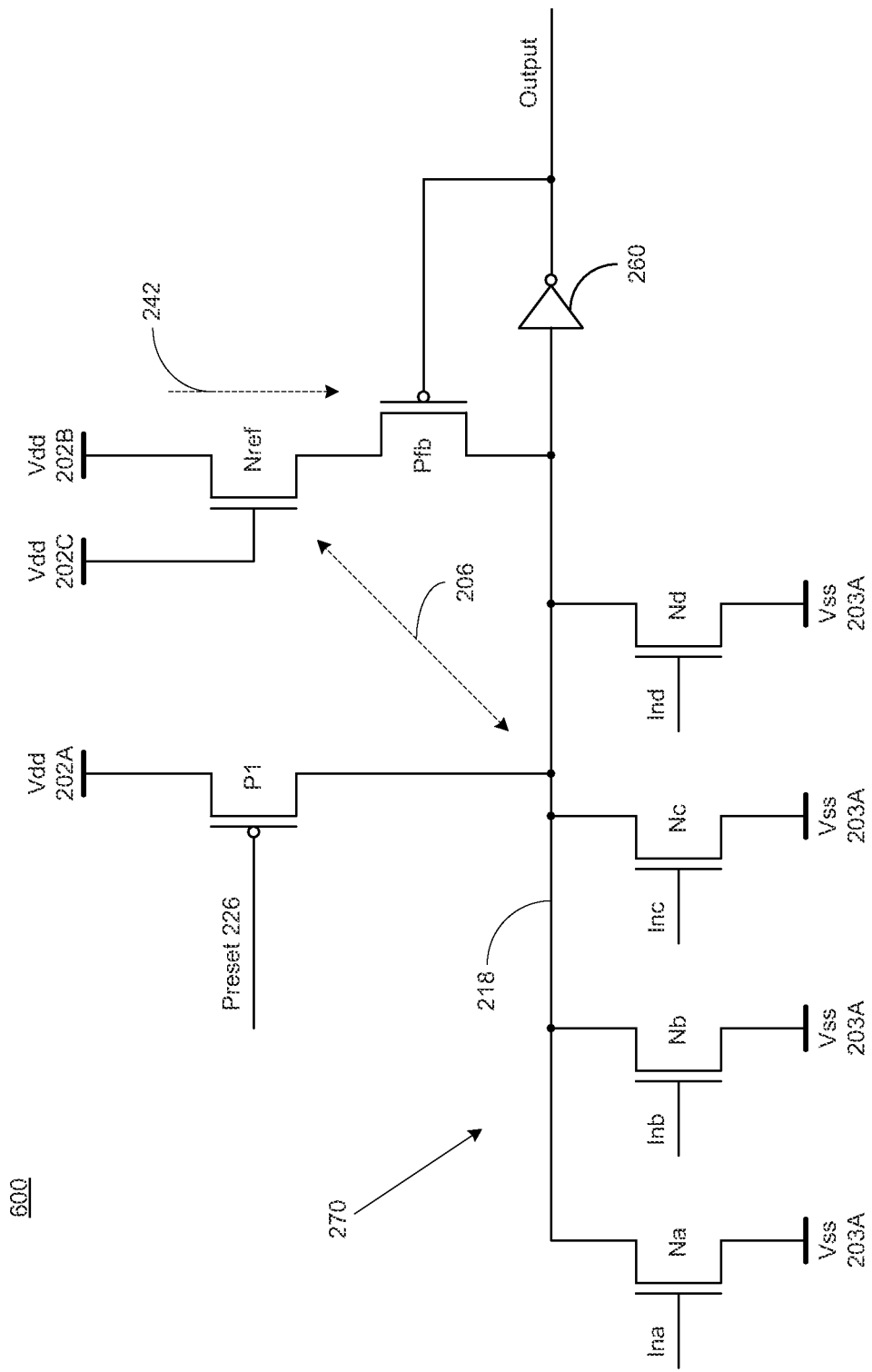

FIG. 6 illustrates a diagram of another keeper circuit 600 in accordance with various implementations described herein. As shown in FIG. 6, the keeper circuit 600 may be implemented as an integrated circuit with multiple stages and may be referred to as keeper circuitry. Further, the multiple stages may be referred to as multiple sub-divided circuit portions having interdependent relationship.

The keeper circuit 600 is similar to the keeper circuit 200 of FIG. 2 with some modification. For instance, the keeper circuit 600 may be used in a dynamic multi-NOR gate configuration (e.g., 4 NOR gates). In this instance, the NMOS transistor Nref is positioned between the voltage supply Vdd 202B and the lower PMOS transistor Pfb, and the voltage supply Vdd 202C may be coupled to the gate of the NMOS transistor Nref. Further, a preset input signal 226 may be provided to the gate of the first PMOS transistor P1. In some implementations, the multi-NOR gate type of configuration 270 may refer to use of 4 NOR gates, such as, e.g., a first NOR gate Na, a second NOR gate Nb, a third Nor gate Nc, and a fourth NOR gate Nd. As shown in FIG. 6, these NOR gates Na, Nb, Nc, Nd may be disposed between an input line 218 and the voltage supply Vss 203A, which may refer to a ground rail (GND). The input line 218 may be coupled to an input of the logic device 260. Further, an input signal may be provided to each of the NOR gates. For instance, the first NOR gate Na may be provided with a first input Ina, the second NOR gate Nb may be provided with a second input Inb, the third NOR gate Nc may be provided with a third input Inc, and the fourth NOR gate Nd may be provided with a fourth input Ind.

In some implementations, the keeper circuit 600 provides for process tracking 206 between the input NMOS transistors Na, Nb, Nc, Nd of the multi-NOR gate type of configuration 270 and the keeper NMOS transistor Nref. As with other configurations described herein, this configuration 270 provides the NMOS transistor Nref in the keeper path 242 which tracks the process corners. As such, this configuration 270 may increase read speed as weak read current is not over compensated for by a strong keeper.

Figure 7:
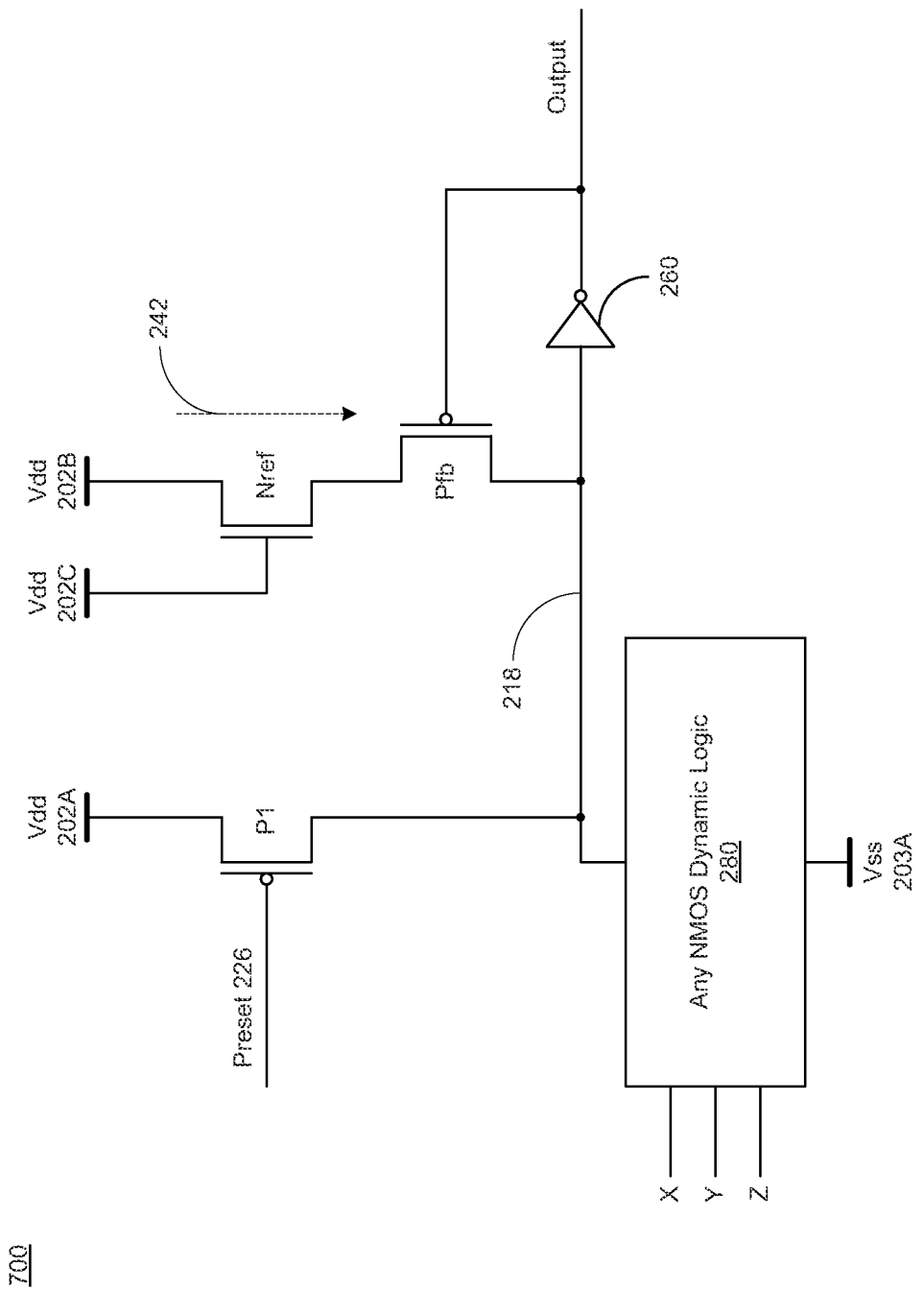

FIG. 7 illustrates a diagram of another keeper circuit 700 in accordance with various implementations described herein. As shown in FIG. 7, the keeper circuit 700 may be implemented as an integrated circuit with multiple stages and may be referred to as keeper circuitry. Further, the multiple stages may be referred to as multiple sub-divided circuit portions having interdependent relationship.

In reference to the embodiment of FIG. 7, the keeper circuit 700 is similar to the keeper circuit 200 of FIG. 2 with some modification. For instance, the keeper circuit 700 may be used in any NMOS dynamic logic configuration 280. In this instance, the NMOS transistor Nref is positioned between the voltage supply Vdd 202B and the lower PMOS transistor Pfb, and the voltage supply Vdd 202C may be coupled to the gate of the NMOS transistor Nref. The preset input signal 226 may be provided to the gate of the first PMOS transistor P1. In some implementations, NMOS dynamic logic configuration 280 may be disposed between the input line 218 and the voltage supply Vss 203A, which may refer to the ground rail or ground (GND). The input line 218 may be coupled to an input of the logic device 260. Further, one or more inputs may be provided to the NMOS dynamic logic configuration 280. For instance, a first input X, a second input Y, and the third input Z may be provided to the NMOS dynamic logic configuration 280.

In some implementations, the keeper circuit 700 provides for process tracking 208 between the NMOS dynamic logic configuration 280 and the keeper NMOS transistor Nref. For instance, as with other configurations described herein, this configuration 280 provides the NMOS transistor Nref in the keeper path 242 which tracks the process corners. As such, this configuration 280 may increase read speed as weak read current is not over compensated for by a strong keeper.

Figure 8:
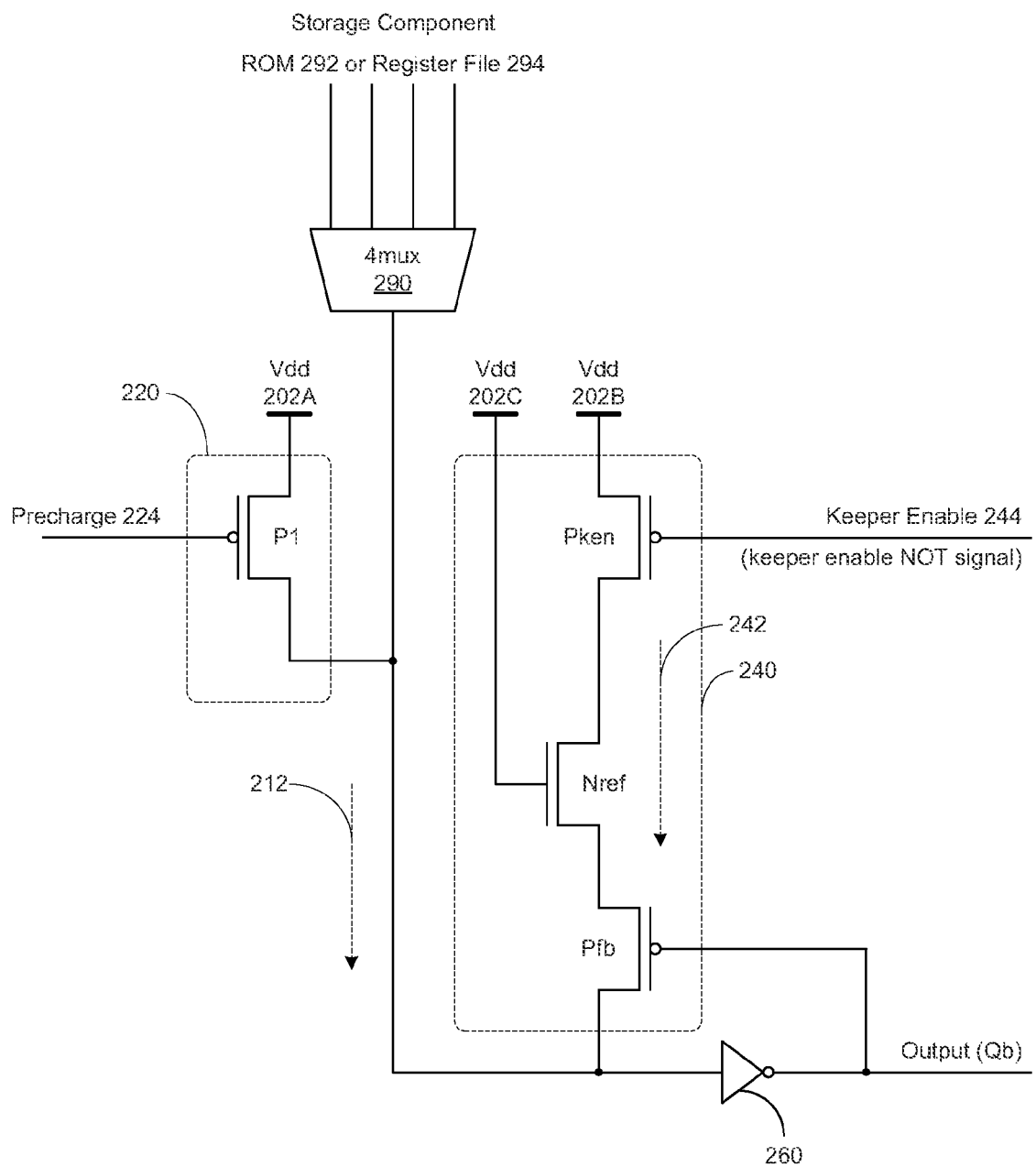

FIG. 8 illustrates a diagram of another keeper circuit 800 in accordance with various implementations described herein. As shown in FIG. 8, the keeper circuit 800 may be implemented as an integrated circuit with multiple stages and may be referred to as keeper circuitry. Further, the multiple stages may be referred to as multiple sub-divided circuit portions having interdependent relationship.

The keeper circuit 800 is similar to the keeper circuit 200 of FIG. 2 with some modification. For instance, the keeper circuit 800 may be used in various memory device applications. In this instance, the bitline may be coupled to a multiplexor (MUX), such as, e.g., a 4-input pass gate MUX (a physical pass-thru), which is further coupled to a storage component, such as, e.g., ROM 292 of a register file 294. Generally, in various implementations, the embodiment of FIG. 8 represents an overall schematic of a memory device configured for using keeper circuitry, as described herein.

In accordance with aspects of the disclosure, keeper circuitry described herein may provide one or more or all of the following advantages. Generally, an advantage of these types of configurations may be achieved with faster timings in utilization scenarios, such as, e.g., when the keeper has to be always on and in low voltage regions. In some implementations, the keeper circuitry, as described herein, may be implemented a register file two port, RF2 memory where this structure is used twice in series (double gain) in the read path. However, various implementations described herein may also be used in ROM designs having a keeper, which may improve read speed for ROM. In some scenarios, due to low timing impact (~5%), the keeper may be on all the time, thus simplifying integrated circuit designs, margining, characterization and validation. Further, various implementations described herein may also be used in modern technologies having low voltage modes and other new technology. Accordingly, the various implementations described herein provide effective keeper circuitry that improves power, performance and area (PPA) and/or voltage range of an integrated circuit.

Although particular embodiments have been described herein, it will be apparent that these particular embodiments should not be limited thereto, and that many modifications and/or additions may be made within the particular embodiments of the disclosure. For instance, various combinations of features of the dependent claims may be made with features of the independent claims without departing from the particular embodiments.

Further, various techniques of embodiments described herein are applicable across a variety of technologies, and for various different types of memory cells. For instance, the particular embodiments may be used irrespective of whether individual memory cells are constructed using bulk CMOS (Complementary Metal-Oxide-Semiconductor) technology or constructed using SOI (Silicon-On-Insulator) technology. Further, various techniques of embodiments described herein are not restricted to memory devices using memory cells, but may be applied to memory devices using various other types of memory cells that are subjected to read and/or write operations.

Still further, various techniques of embodiments described herein may be implemented with an NMOS matrix and an NMOS keeper. However, in reference to CMOS technology, various techniques of embodiments described herein may be implemented with a PMOS matrix and a PMOS keeper. Thus, various techniques of embodiments described herein refer to matching the device type of the keeper/bleeder with the device type of the matrix (i.e., the device type needing leakage compensation).

Described herein are various implementations of an integrated circuit. In some implementations, the integrated circuit may include a keeper circuit coupled to a bitline input path. The keeper circuit may be configured to provide a first voltage source signal to the bitline input path based on a keeper enable signal. The keeper circuit may include an NMOS transistor. Further, the integrated circuit may include a logic device coupled to the bitline input path. The logic circuit may be configured to receive the bitline input signal, receive the first voltage source signal from the keeper circuit, and provide an inverted bitline input signal as an output signal.

Described herein are various implementations of an integrated circuit. In some implementations, the integrated circuit may include a bitline input path, a pre-charge circuit, a keeper circuit, and a logic device. The precharge circuit may be coupled to the bitline input path, and the precharge circuit may be configured to provide a first voltage source signal to the bitline input path based on a precharge enable signal. The keeper circuit may be coupled to the bitline input path, and the keeper circuit may be configured to provide a second voltage source signal to the bitline input path via a keeper path based on a keeper enable signal. The keeper circuit may include at least one NMOS transistor coupled to the keeper path. The logic device may be coupled to the bitline input path, and the logic device may be configured to receive the bitline input signal, receive the first voltage source signal from the precharge circuit, receive the second voltage source signal from the keeper circuit, and provide an inverted bitline input signal as an output signal.

Described herein are various implementations of a keeper circuit. In some implementations, the keeper circuit may include an NMOS transistor configured to activate based on a first voltage source signal. The keeper circuit may include a first PMOS transistor coupled to the NMOS transistor. The first PMOS transistor may be configured to provide the first voltage source signal to the NMOS transistor based on a keeper enable signal. Further, the keeper circuit may include a second PMOS transistor coupled to the NMOS transistor. The second PMOS transistor may be configured to provide the first voltage source signal to the bitline input path based on an inverted bitline input signal received from a logic device as an output signal.

The discussion provided herein is directed to certain specific implementations. It should be understood that the discussion provided herein is provided for the purpose of enabling a person with ordinary skill in the art to make and use any subject matter defined herein by the subject matter of the claims.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve a developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   a keeper circuit coupled to a bitline input path and configured to provide a first voltage source signal to the bitline input path based on a keeper enable signal, wherein the keeper circuit includes an n-type metal-oxide-semiconductor (NMOS) transistor, a first p-type MOS (PMOS) transistor, and a second PMOS transistor; and
   a logic device coupled to the bitline input path and configured to receive a bitline input signal, receive the first voltage source signal from the keeper circuit, and provide an inverted bitline input signal as an output signal,
   wherein the NMOS transistor is coupled between the first PMOS transistor and the second PMOS transistor, wherein the first PMOS transistor is configured to provide the first voltage source signal to the NMOS transistor based on a power gating signal,
   wherein the NMOS transistor is configured to receive the first voltage source signal from the first PMOS transistor and provide the first voltage source signal to the second PMOS transistor based on the keeper enable signal, and wherein the second PMOS transistor is configured to provide the first voltage source signal to the bitline input path based on the inverted bitline input signal received from the logic device.

2. The integrated circuit of claim 1, further comprising a precharge circuit coupled to the bitline input path and configured to provide a second voltage source signal to the bitline input path based on a precharge enable signal.

3. The integrated circuit of claim 2, wherein the precharge circuit comprises a third PMOS transistor coupled to the bitline input path, wherein the third PMOS transistor is configured to provide the second voltage source signal to the bitline input path based on the precharge enable signal.

4. The integrated circuit of claim 2, wherein the first and second voltage source signals are provided by a same voltage source.

5. The integrated circuit of claim 1, wherein the NMOS transistor comprises a Fin-shaped Field Effect Transistor (FinFET), and wherein the logic device comprises an inverter or a NAND gate.

6. An integrated circuit, comprising:
a bitline input path;
a precharge circuit coupled to the bitline input path and configured to provide a first voltage source signal to the bitline input path based on a precharge enable signal;
a keeper circuit coupled to the bitline input path and configured to provide a second voltage source signal to the bitline input path via a keeper path based on a keeper enable signal, wherein the keeper circuit includes an n-type metal-oxide-semiconductor (NMOS) transistor and a first p-type MOS (PMOS) transistor coupled to the keeper path; and
a logic device coupled to the bitline input path and configured to receive the bitline input signal, receive the first voltage source signal from the precharge circuit, receive the second voltage source signal from the keeper circuit, and provide an inverted bitline input signal as an output signal,
wherein the NMOS transistor is coupled between the first PMOS transistor and the bitline input path, wherein the first PMOS transistor is configured to provide the second voltage source signal to the NMOS transistor based on the keeper enable signal, and
wherein the NMOS transistor is configured to receive the second voltage source signal from the first PMOS transistor and provide the second voltage source signal to the bitline input path based on a third voltage source signal.

7. The integrated circuit of claim 6, wherein the precharge circuit comprises another p-type metal-oxide-semiconductor (PMOS) transistor coupled to the bitline input path, wherein the another PMOS transistor is configured to provide the first voltage source signal to the bitline input path based on the precharge enable signal.

8. The integrated circuit of claim 6, wherein the keeper circuit comprises a second PMOS transistor coupled to the keeper path after the NMOS transistor, wherein the second PMOS transistor is configured to provide the second voltage source signal to the bitline input path based on the inverted bitline input signal received from the logic device.

9. The integrated circuit of claim 8, wherein the NMOS transistor is configured to provide the second voltage source signal to the second PMOS transistor via the keeper path based on the third voltage source signal.

10. The integrated circuit of claim 6, wherein the NMOS transistor comprises a Fin-shaped Field Effect Transistor (FinFET), and wherein the logic device comprises an inverter or a NAND gate.

11. The integrated circuit of claim 6, wherein the first, second, and third voltage source signals are provided by a same voltage source.

12. A keeper circuit, comprising:
an n-type metal-oxide-semiconductor (NMOS) transistor configured to activate based on a first voltage source signal;
a first p-type metal-oxide-semiconductor (PMOS) transistor coupled to the NMOS transistor, wherein the first PMOS transistor is configured to provide a second voltage source signal to the NMOS transistor based on a keeper enable signal;
a second PMOS transistor coupled to the NMOS transistor, wherein the second PMOS transistor is configured to provide the second voltage source signal to a bitline input path based on an inverted bitline input signal received from a logic device as an output signal,
wherein the NMOS transistor is coupled between the first PMOS transistor and the second PMOS transistor, and
wherein the NMOS transistor is configured to receive the second voltage source signal from the first PMOS transistor and provide the second voltage source signal to the second PMOS transistor based on the first voltage source signal.

13. The keeper circuit of claim 12, further comprising a precharge circuit coupled to the bitline input path and configured to provide a third voltage source signal to the bitline input path based on a precharge enable signal, wherein the precharge circuit comprises a third PMOS transistor coupled to the bitline input path, wherein the third PMOS transistor is configured to provide the third voltage source signal to the bitline input path based on the precharge enable signal.

14. The integrated circuit of claim 13, wherein the first, second, and third voltage source signals are provided by a same voltage source.

15. The keeper circuit of claim 12, wherein the logic device is coupled to the bitline input path and is configured to receive a bitline input signal, receive the second voltage source signal from the second PMOS transistor, and provide the inverted bitline input signal, and wherein the logic device comprises an inverter or a NAND gate.

* * * * *